US009865567B1

(12) United States Patent
Chaware et al.

(10) Patent No.: US 9,865,567 B1
(45) Date of Patent: Jan. 9, 2018

(54) HETEROGENEOUS INTEGRATION OF INTEGRATED CIRCUIT DEVICE AND COMPANION DEVICE

(71) Applicant: Xilinx, Inc., San Jose, CA (US)

(72) Inventors: Raghunandan Chaware, Sunnyvale, CA (US); Ganesh Hariharan, Santa Clara, CA (US); Inderjit Singh, Saratoga, CA (US); Amitava Majumdar, San Jose, CA (US); Glenn O'Rourke, Gilroy, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/423,303

(22) Filed: Feb. 2, 2017

(51) Int. Cl.
*H01L 21/58* (2006.01)
*H01L 25/065* (2006.01)
*H01L 25/00* (2006.01)
*H01L 21/82* (2006.01)
*H01L 21/66* (2006.01)
*H01L 23/00* (2006.01)
*H01L 21/56* (2006.01)
*H01L 25/16* (2006.01)

(52) U.S. Cl.
CPC ........ *H01L 25/0655* (2013.01); *H01L 21/563* (2013.01); *H01L 21/82* (2013.01); *H01L 22/20* (2013.01); *H01L 24/17* (2013.01); *H01L 25/50* (2013.01); *H01L 22/14* (2013.01); *H01L 25/16* (2013.01); *H01L 2224/17181* (2013.01)

(58) Field of Classification Search
CPC ........ H01L 25/16; H01L 21/563; H01L 22/14

USPC .......................................... 438/113
See application file for complete search history.

(56) References Cited

U.S. PATENT DOCUMENTS

| | | | |
|---|---|---|---|
| 9,437,583 B1* | 9/2016 | Shih | H01L 25/105 |
| 2004/0164390 A1* | 8/2004 | Wang | H01L 23/13 |
| | | | 257/686 |
| 2005/0048698 A1* | 3/2005 | Yamaguchi | H01L 21/76898 |
| | | | 438/109 |
| 2006/0016540 A1* | 1/2006 | Yoshino | H01L 21/67132 |
| | | | 156/64 |
| 2007/0126085 A1* | 6/2007 | Kawano | H01L 21/76898 |
| | | | 257/621 |
| 2009/0224401 A1* | 9/2009 | Fujii | H01L 23/16 |
| | | | 257/737 |
| 2010/0025841 A1* | 2/2010 | Kakegawa | H01L 23/562 |
| | | | 257/692 |
| 2010/0133704 A1* | 6/2010 | Marimuthu | H01L 21/565 |
| | | | 257/778 |
| 2011/0215470 A1* | 9/2011 | Chen | H01L 23/52 |
| | | | 257/738 |

(Continued)

*Primary Examiner* — George Fourson, III
(74) *Attorney, Agent, or Firm* — Robert M. Brush

(57) ABSTRACT

An example method of manufacturing a semiconductor assembly includes: forming first integrated circuit (IC) dies and dummy dies; forming an interposer wafer including a top side having first mounting sites for the first IC dies and second mounting sites for second IC dies; attaching the first IC dies to the interposer wafer at the first mounting sites and the dummy dies to the interposer wafer at the second mounting sites; processing a backside and the top side of the interposer wafer; removing the dummy dies from the top side of the interposer wafer to expose the second mounting sites; and attaching the second IC dies to the interposer wafer at the exposed second mounting sites.

16 Claims, 7 Drawing Sheets

(56) References Cited

U.S. PATENT DOCUMENTS

| | | | |
|---|---|---|---|
| 2011/0278732 A1* | 11/2011 | Yu | H01L 23/481 |
| | | | 257/774 |
| 2013/0119552 A1* | 5/2013 | Lin | H01L 25/0652 |
| | | | 257/774 |
| 2015/0093858 A1* | 4/2015 | Hwang | H01L 24/96 |
| | | | 438/113 |
| 2015/0311182 A1* | 10/2015 | Lee | H01L 23/3737 |
| | | | 257/734 |
| 2016/0358865 A1* | 12/2016 | Shih | H01L 24/02 |
| 2017/0018529 A1* | 1/2017 | Katkar | H01L 25/0652 |

* cited by examiner

HETEROGENEOUS INTEGRATION OF INTEGRATED CIRCUIT DEVICE AND COMPANION DEVICE

TECHNICAL FIELD

Examples of the present disclosure generally relate to a semiconductor device manufacturing, in particular, to heterogeneous integration of an integrated circuit (IC) device and a companion device.

BACKGROUND

Semiconductor device fabrication is a complex process that involves many manufacturing and testing steps. In some processes, multiple semiconductor devices are being assembled in a common package. For example, multiple integrated circuit (IC) dies can be mounted to an interposer, and the resulting stacked assembly packaged as a single device. The IC dies can be heterogeneous. For example, a package can include a programmable IC die, such as a field programmable gate array (FPGA), and a companion IC die, such as a memory. Currently, the companion IC dies are assembled on the interposer wafer along with the programmable IC dies at the start of the assembly process. Such an assembly flow creates thermal and charge damage to the companion IC dies, as the companion IC dies will go through multiple thermal cycles during the assembly process. Moreover, if the programmable IC die fails electrical testing, the companion IC die will be wasted or otherwise requires removal from the interposer wafer. Thus, the current assembly flow increases costs.

SUMMARY

Techniques for heterogeneous integration of an integrated circuit (IC) device and a companion device are described. In an example, a method of manufacturing a semiconductor assembly includes: forming first integrated circuit (IC) dies and dummy dies; forming an interposer wafer including a top side having first mounting sites for the first IC dies and second mounting sites for second IC dies; attaching the first IC dies to the interposer wafer at the first mounting sites and the dummy dies to the interposer wafer at the second mounting sites; processing a backside and the top side of the interposer wafer; removing the dummy dies from the top side of the interposer wafer to expose the second mounting sites; and attaching the second IC dies to the interposer wafer at the exposed second mounting sites.

In another example, a semiconductor assembly is prepared by a process comprising steps of forming first integrated circuit (IC) dies and dummy dies; forming an interposer wafer including a top side having first mounting sites for the first IC dies and second mounting sites for second IC dies; attaching the first IC dies to the interposer wafer at the first mounting sites and the dummy dies to the interposer wafer at the second mounting sites; processing a backside and the top side of the interposer wafer; removing the dummy dies from the top side of the interposer wafer to expose the second mounting sites; and attaching the second IC dies to the interposer wafer at the exposed second mounting sites.

In another example, a semiconductor assembly includes: an interposer wafer including a top side having first mounting sites and second mounting sites each configured to support electrical and mechanical connection with integrated circuit (IC) dies; first IC dies electrically and mechanically coupled to the interposer wafer at the first mounting sites; and dummy dies mechanically attached to the second mounting sites.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
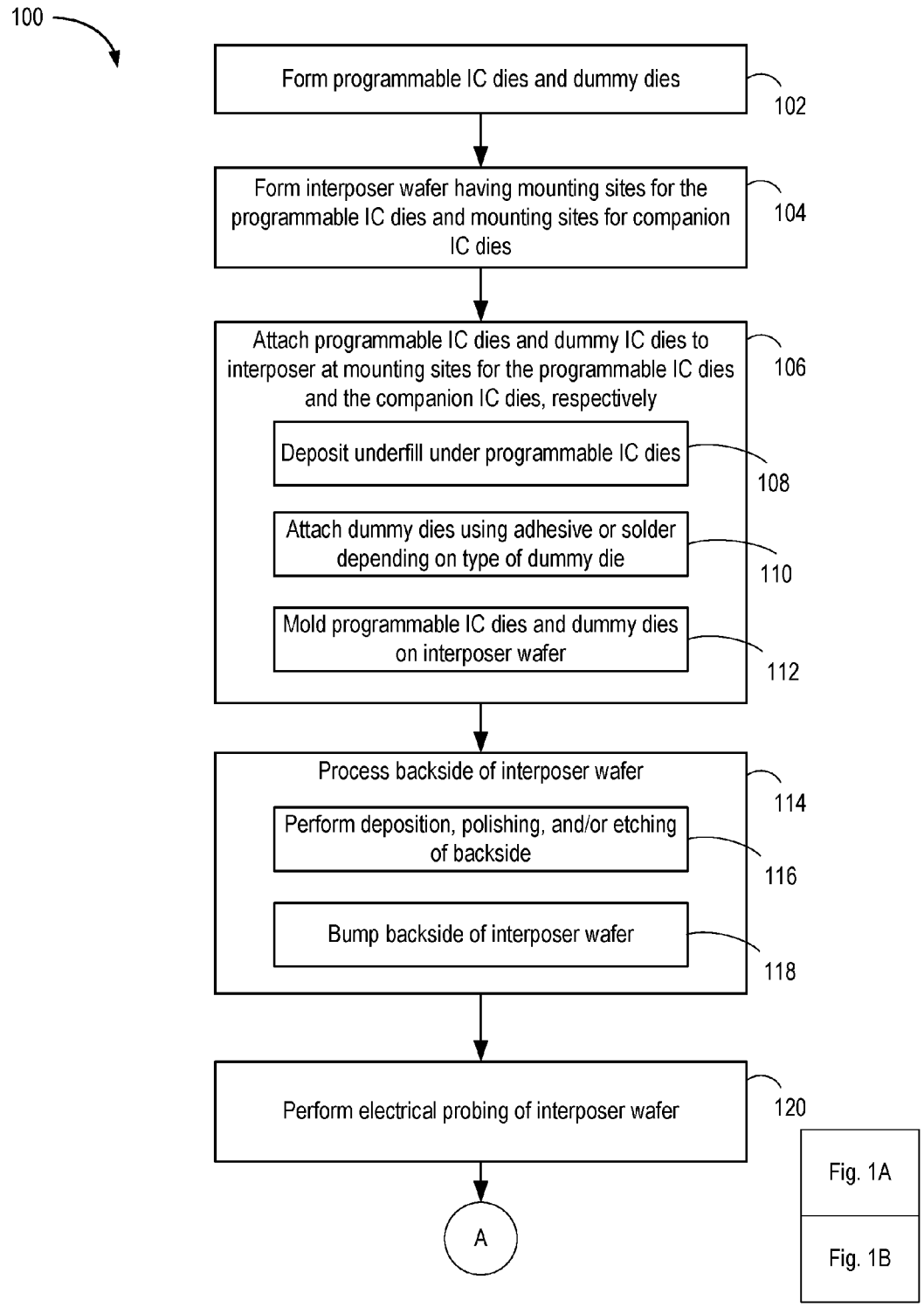
FIGS. 1A-1B depict a flow diagram of a method of manufacturing a semiconductor assembly according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Heterogeneous integration of an integrated circuit (IC) device and a companion device is described. In one type of chip-on-wafer-on-substrate (CoWoS) process, all active devices are mounted on the interposer wafer at the start of the process. Combining primary and companion IC dies at the start of the CoWoS process has several disadvantages. First, interposer backside processing with companion IC dies can lead to severe thermal and charge induced transistor damage of the companion IC dies. Second, the companion IC dies will be part of the overall line yield losses, which has a significant cost impact. Third, random combination of primary and companion IC dies may lead to lower speeds and underperforming products. Fourth, combining IC dies of different sizes at the same time can lead to warpage-induced assembly issues. Finally, the companion IC dies may not have the same height as the primary IC dies, which lead to poor thermal performance of the resulting packages.

In examples described herein, a hybrid CoWoS technique is used to mitigate the above-described disadvantages. In the hybrid CoWoS assembly process, the primary IC dies are attached along with dummy dies, rather than the companion IC dies. The interposer is then processed (e.g., backside and top side processing), and electrical testing is performed. The dummy dies are then removed from the interposer wafer, and the companion IC dies are attached in their places. In the hybrid CoWoS process, the companion IC dies are not part of the inline assembly yield losses. This provides a significant cost savings. Further, the companion IC dies are protected from thermal, electrical, and electromagnetic exposure during interposer processing and electrical testing. In addition, the companion IC dies can be thicker (e.g., higher) than the primary IC dies without decreasing thermal performance of the resulting packages. Also, the primary IC dies can be electrically tested on the interposer wafer prior to attaching the companion IC dies. This allows the companion IC dies to be attached along with known good primary IC dies and avoids having to waste or remove companion IC dies that are mounted alongside defective primary IC dies. In some cases, the companion IC dies are expensive relative to the primary IC dies (e.g., the primary IC die can be an FPGA and the companion IC die can be a high-end memory die). In such cases, the hybrid CoWoS assembly process avoids pairing the relatively expensive companion IC dies with primary IC dies that do not satisfy the electrical tests.

Figure 1B:
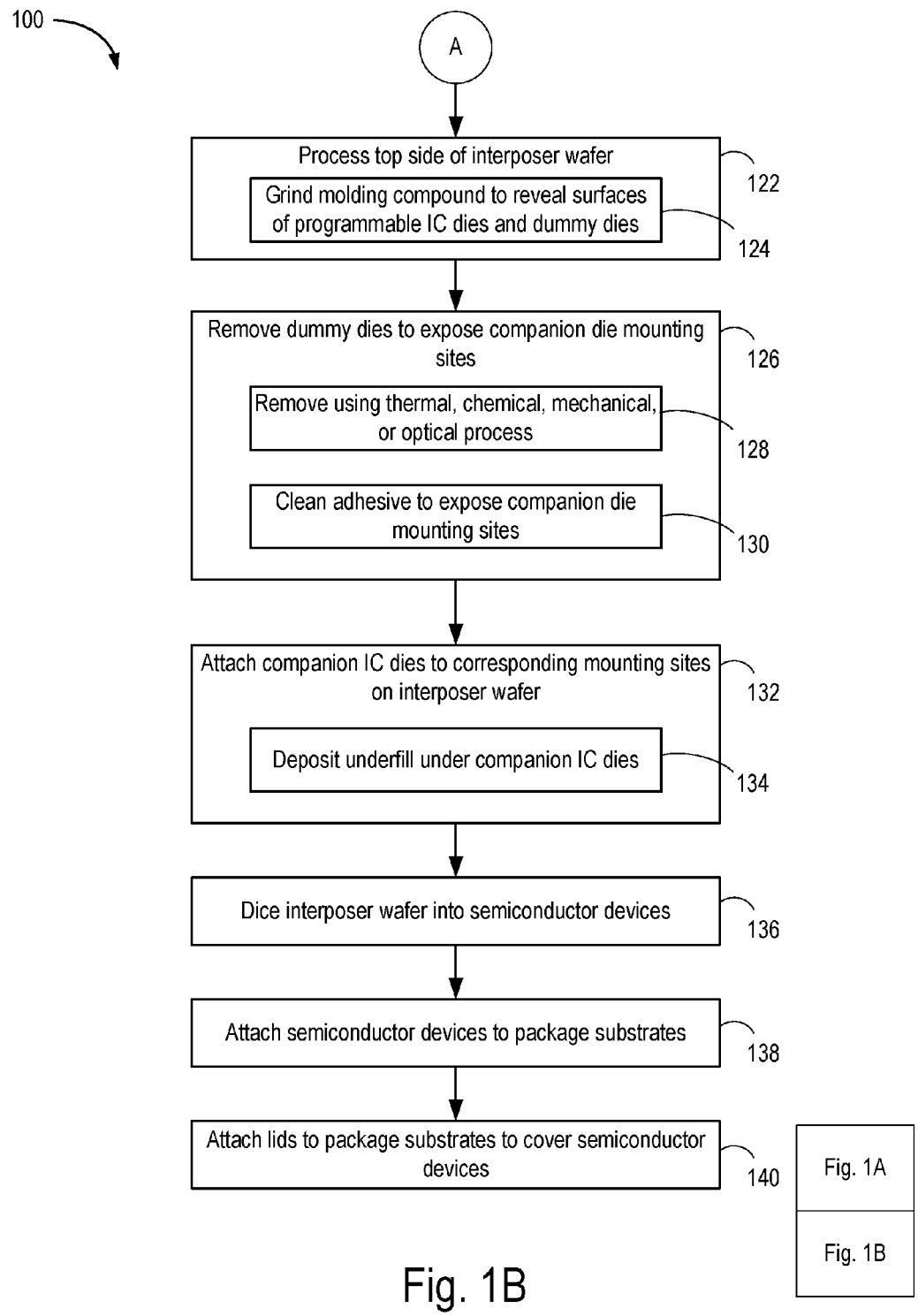

FIGS. 1A-1B depict a flow diagram of a method 100 of manufacturing a semiconductor assembly according to an example. FIGS. 2A-2J depict cross-sections of semiconductor devices corresponding to the various steps of the method 100. The method 100 can be performed by various semiconductor manufacturing tools known in the art. The method 100 begins at step 102, where the tools form programmable IC dies and dummy dies. In an example, the programmable IC dies are formed on a wafer using conventional semiconductor fabrication techniques. The wafer is bumped to provide electrical contacts for the programmable IC dies. The wafer is then diced to separate the programmable IC dies. The programmable IC dies can be field programmable gate arrays (FPGAs), complex programmable logic devices (CPLDs), or the like. Although the method 100 is described with respect to programmable IC dies, those skilled in the art will appreciate that the method is applicable to IC dies in general, such as application specific integrated circuit (ASIC) dies, microelectromechanical systems (MEMS) devices, optical devices, and the like. In an example, the dummy dies comprise glass substrates. The dummy dies can be formed on a wafer and diced to separate the dummy dies.

At step 104, the tools form an interposer wafer having mounting sites for the programmable IC dies and mounting sites for companion IC dies. Companion IC dies can be any type of IC, such as a memory, an ASIC, or the like. Eventually, the interposer wafer is diced to form a plurality of semiconductor devices. Each of the semiconductor devices includes at least one programmable IC die and at least one companion IC die. The interposer wafer can be any type of organic or inorganic substrate.

Figure 2A:
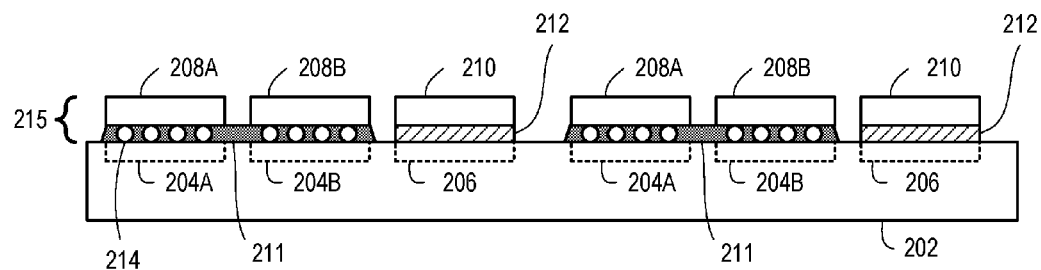
FIGS. 2A-2J depict cross-sections of semiconductor devices corresponding to the various steps of the method of FIGS. 1A-1B.

At step 106, the tools attach the programmable IC dies and the dummy dies to a top-surface of the interposer at mounting sites for the programmable IC dies and the companion IC dies, respectively. FIG. 2A is a cross-sectional view of an interposer wafer 202 according to an example. In the example, the interposer wafer 202 includes mounting sites 204A and 204B for programmable IC dies 208A and 208B, and mounting sites 206 for companion IC dies 222 (shown in FIG. 2G below). Each mounting site 204A, 204B includes metallization (e.g., bond pads) configured to interface with bumps 214 of the programmable IC dies 208A, 208B. Each mounting site 206 includes metallization (e.g., bond pads) configured to interface with bumps of a companion IC die.

Each set of a programmable IC die 208A, a programmable IC die 208B, and a companion die is part of a semiconductor device. Thus, the interposer wafer 202 includes metallization (not shown) configured to electrically connect a programmable IC die 208A, a programmable IC die 208B, and a companion IC die of each semiconductor device. In the example cross-section, two semiconductor devices are shown. In general, the interposer wafer 202 can include any number of semiconductor devices. Further, while each semiconductor device is described as having two programmable IC dies and one companion IC die, in general each semiconductor device can have at least one programmable IC die and at least one companion IC die. At step 106, the companion IC dies are not attached to the interposer wafer 202. Rather, a dummy die 210 is attached to the interposer wafer 202 at each mounting site 206.

The step 106 of attaching the programmable IC dies 208A, 208B and the dummy dies 210 can include various sub-steps. At step 108, the tools can deposit underfill 211 beneath the programmable IC dies 208A and the programmable IC dies 208B. At step 110, the tools can attach the dummy dies 210 using an adhesive 212. In other examples discussed further below, the dummy dies 210 can include electrical contacts (e.g., bumps). In such an example, at step 110, the dummy dies 210 can be soldered to the metallization of the mounting sites 206. Each programmable IC die 208A, 208B stands off from the interposer wafer 202 at a height 215. In an example, the thickness of the dummy dies 210 and the adhesive 212 is controlled so that the height of the dummy dies 210 is substantially the same as the height 215 of the programmable IC dies 208A, 208B.

Figure 2B:
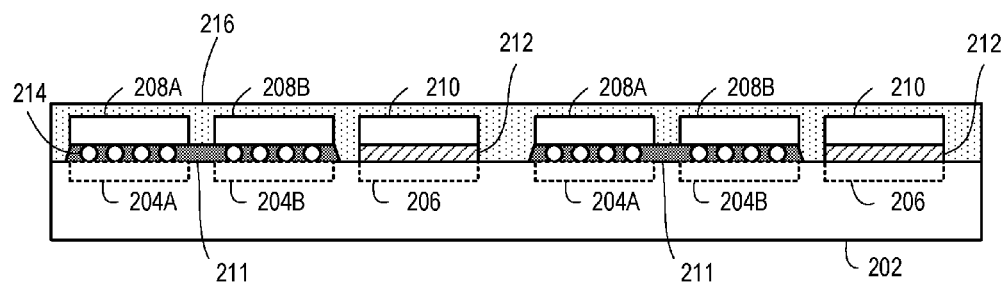

At step 112, the tools can mold the programmable IC dies 208A, 208B and the dummy dies 210 on the interposer wafer 202. FIG. 2B shows a cross-section of the interposer wafer 202 having a molding compound 216 encapsulating the programmable IC dies 208A, 208B and the dummy dies 210. The molding compound 216 can cover the top surfaces of the programmable IC dies 208A, 208B and the top surfaces of the dummy dies 210.

Figure 2C:
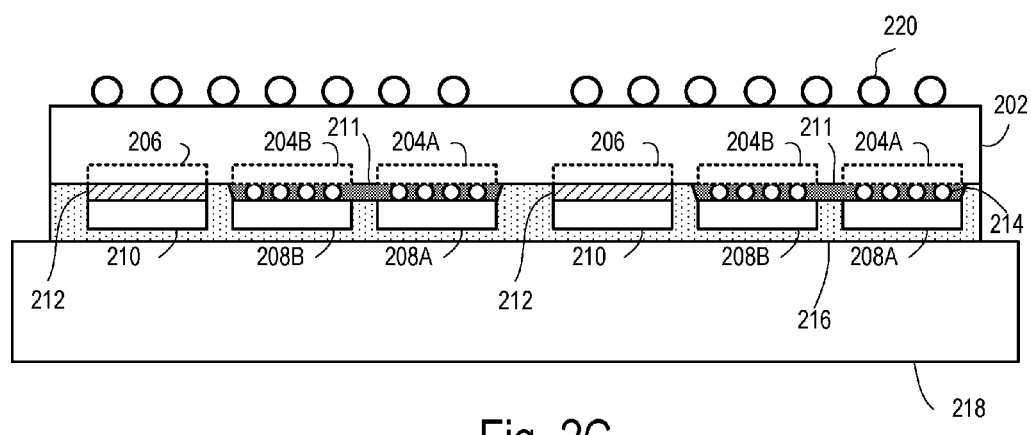

The method 100 proceeds from step 106 to step 114. At step 114, the tools process the backside of the interposer wafer 202 (e.g., the side opposite the top side to which the programmable IC dies 208A, 208B and the dummy dies 210 are attached). The tools can perform various backside processing steps. For example, at step 116, the tools can perform deposition (e.g., chemical vapor deposition), polishing (e.g., chemical metal polishing), etching (e.g., reactive ion etching), and the like, as well as any combination of such processes. At step 118, the tools can bump the backside of the interposer wafer 202 (e.g., C4 bumping). FIG. 2C depicts a cross-section of the interposer wafer 202 attached to a carrier substrate 218. The interposer wafer 202 is attached to the carrier substrate 218 top-side down, allowing the tools to handle the interposer wafer 202 and process the backside of the interposer wafer 202. After backside processing, the interposer wafer 202 includes solder bumps 220 on the backside. The solder bumps 220 are electrically coupled to metallization (not shown) formed on the interposer wafer 202, which can include layers of patterned metal formed on the backside of the interposer wafer 202 and through substrate vias (TSVs) extending through the interposer wafer 202. Notably, the companion IC dies are not subject to any electromechanical stress during the backside processing of the interposer wafer, since the companion IC dies are not yet attached to the interposer wafer.

The method 100 proceeds from step 114 to step 120. At step 120, the tools perform electrical probing of the interposer wafer 202. For example, the tools can probe the solder bumps 220 on the backside of the interposer wafer 202. Various electrical tests can be performed, including electrical testing of the programmable IC dies 208A, 208B, and electrical testing of the metallization on the top surface of the interposer wafer 202 that electrically connects the programmable IC dies 208A, 208B. Notably, the companion IC dies are not subject to any electromechanical stress during the electrically testing of the interposer wafer, since the companion IC dies are not yet attached to the interposer wafer.

Figure 2D:
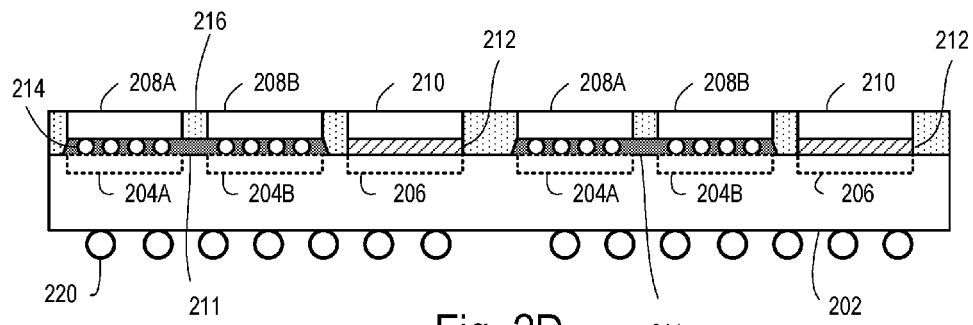

The method 100 proceeds from step 120 to step 122. At step 122, the tools process the top side of the interposer wafer 202. The tools can perform various top side processing steps. For example, at step 124, the tools can grind the molding compound 216 to expose the top surfaces of the programmable IC dies 208A, 208B and the dummy dies 210. FIG. 2D shows a cross-section of the interposer wafer 202 where the molding compound 216 is partially removed to expose the top surfaces of the programmable IC dies 208A, 208B and the dummy dies 210. Notably, the companion IC dies are not subject to any electromechanical stress during the top side processing of the interposer wafer, since the companion IC dies are not yet attached to the interposer wafer. Further, since the dummy dies 210 can be the same or substantially the same height as the programmable IC dies 208A, 208B, there is no remaining molding compound on the top surfaces of the programmable IC dies 208A, 208B. Any remaining molding compound on the top surfaces of the programmable IC dies 208A, 208B would decrease thermal performance of the final semiconductor assembly.

Figure 2E:
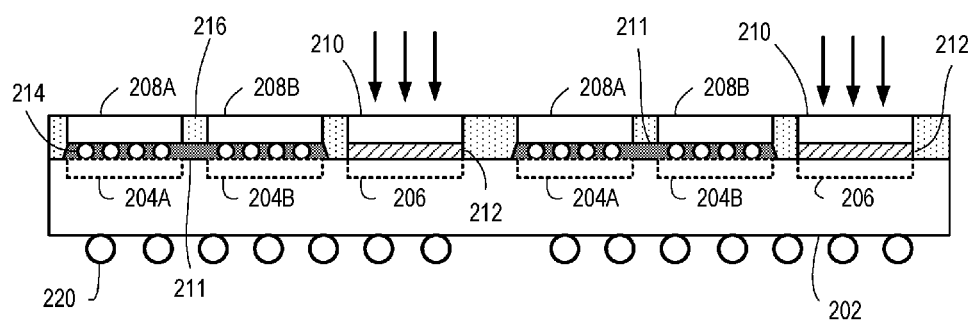
Figure 2F:
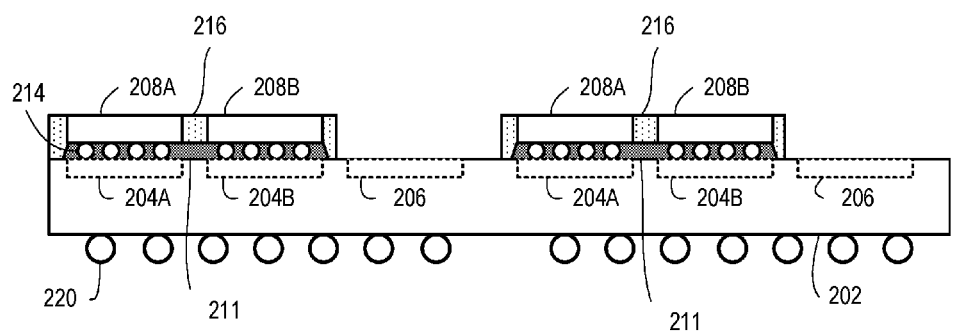

The method 100 proceeds from step 122 to step 126. At step 126, the tools remove the dummy dies 210 to expose the mounting sites 206 for the companion IC dies. For example, at step 128, the tools expose the dummy dies 210 with ultraviolet (UV) light to release the dummy dies 210 from the adhesive 212 (FIG. 2E). In other examples, the tools remove the dummy dies 210 using any thermal, chemical, mechanical, or optical technique known in the art, such as milling, reactive ion etching, mechanical lift off after heating, and the like. At step 130, the tools clean the adhesive 212 to expose the mounting sites 206. FIG. 2F shows a cross-section of the interposer wafer 202 where the dummy dies 210 and the adhesive 212 have been removed. The mounting sites 206 for the companion IC dies are exposed at the top surface of the interposer wafer 202.

Figure 2G:
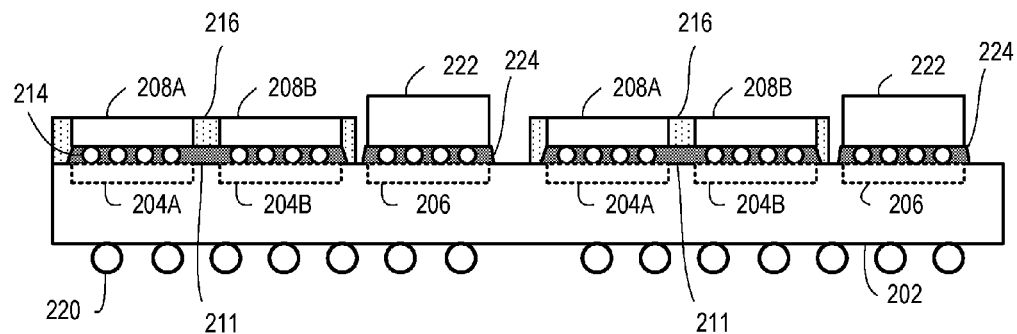

The method 100 proceeds from step 126 to step 132. At step 132, the tools attach the companion IC dies to the mounting sites 206 of the interposer wafer 202. FIG. 2G shows a cross-section of the interposer wafer 202 having companion IC dies 222 attached thereto. The companion IC dies 222 include solder bumps that are mechanically and electrically coupled to the metallization of the mounting sites 206. At step 134, the tools can deposit underfill 225 beneath the companion IC dies 222. In another example, the companion IC dies 222 can have underfill pre-applied and can be attached to the interposer wafer 202 using a thermal compressing bonding technique. In an example, the height of the companion IC dies 222 from the top surface of the interposer wafer 202 can be greater than the height 215 of the programmable IC dies 208A, 208B. Such an example is shown in FIG. 2G. In other examples, the height of the companion IC dies 222 can be the same or less than that of the programmable IC dies 208A, 208B.

Figure 2H:
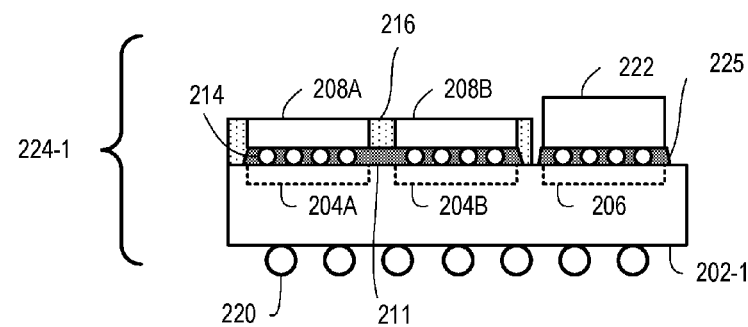
Figure 2H:
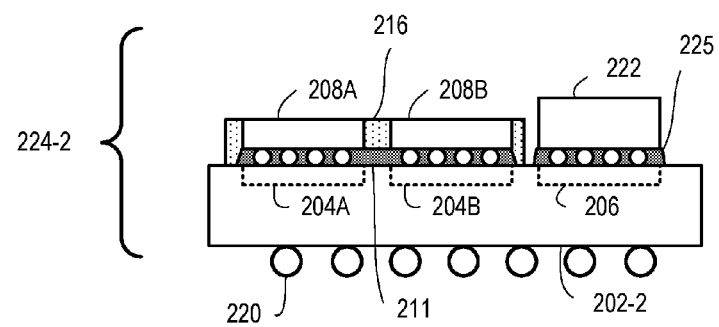

The method 100 proceeds from step 132 to step 136. At step 136, the tools dice the interposer wafer 202 into semiconductor devices. FIG. 2H shows cross-sections of two semiconductor devices 224-1 and 224-2 that have been diced from the interposer wafer 202. Each semiconductor device 224-1, 224-2 includes a programmable IC die 208A, a programmable IC die 208B, and a companion IC die 222 mounted to an interposer 202-1, 202-2.

Figure 2I:
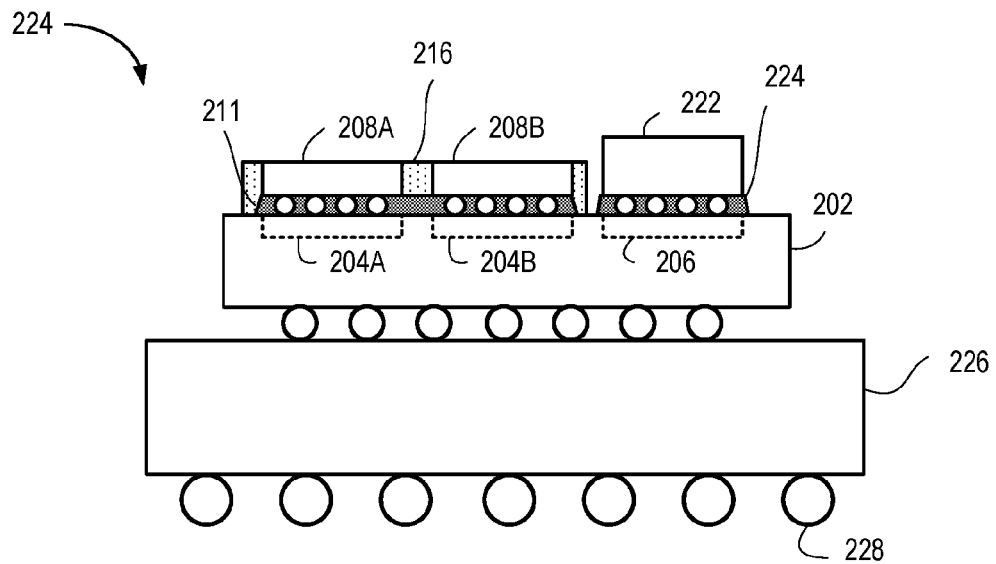

At step 138, the tools attach the semiconductor devices 224 to package substrates. FIG. 2I depicts a cross-section of a semiconductor device 224 mounted to a package substrate 226. The interposer 202 of the semiconductor device 224 is electrically and mechanically mounted to metallization of the package substrate 226 (e.g., bond pads) via the solder bumps 220. The package substrate 226 includes solder balls 228 that are electrically connected to the metallization on the top surface of the package substrate 226.

Figure 2J:
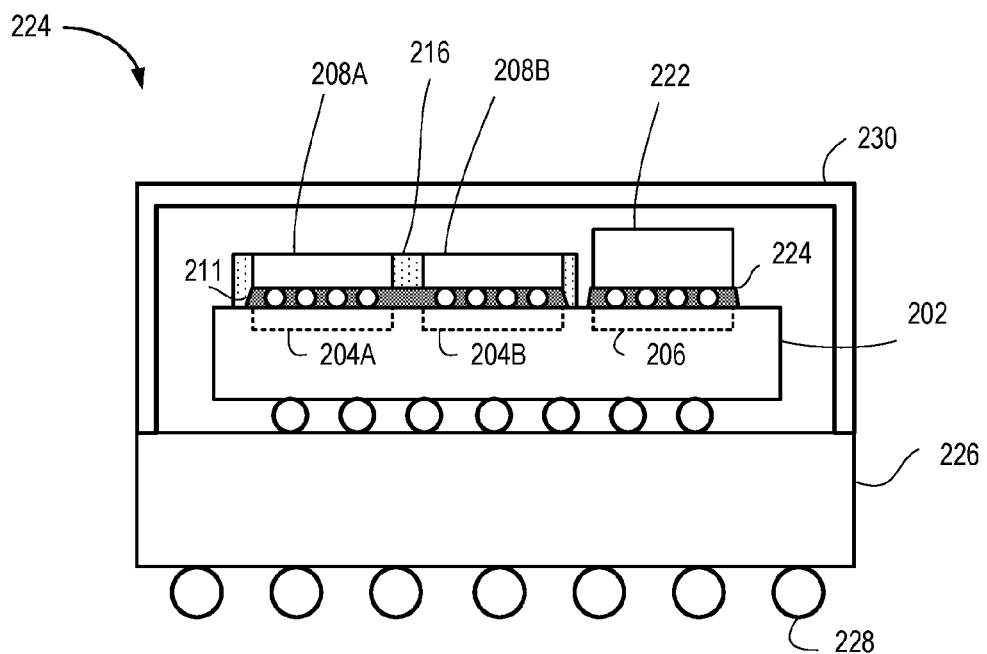

At step 140, the tools attach lids to the package substrates to cover the semiconductor devices. FIG. 2J depicts a cross-section of a semiconductor assembly where a lid 230 is attached to the package substrate 226. The semiconductor assembly can include thermal interface material (not shown) disposed between the lid 230 and the top surfaces of the programmable IC dies 208A, 208B and the companion IC die 222.

Figure 3:
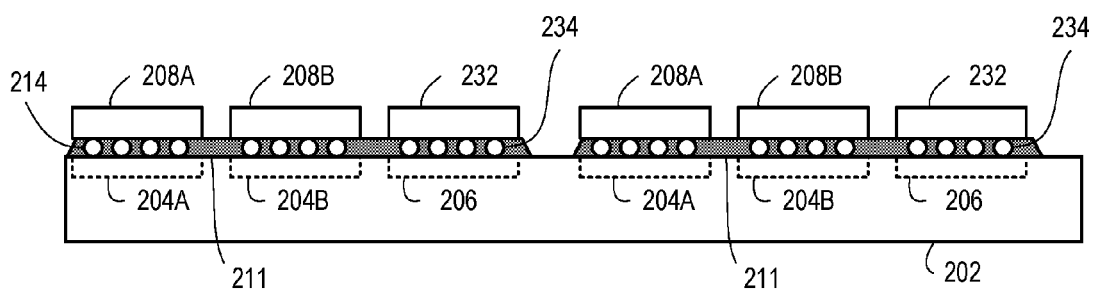
FIG. 3 is a cross-section showing an interposer wafer according to another example.

FIG. 3 is a cross-section showing the interposer wafer 202 according to another example. In the example of FIG. 3, dummy dies 232 are provided in place of the dummy dies 210. The dummy dies 232 include solder bumps 234 that are electrically and mechanically coupled to metallization of the mounting sites 206. The underfill 211 can extend beneath the dummy dies 232 (as shown in the example) or can be deposited only beneath the programmable IC dies 208A, 208B. The dummy dies 232 include metallization electrically coupled to the solder bumps 234. The dummy dies 232 can be glass substrates or the like, or can be semiconductor substrates. In cases where the dummy dies 232 are semiconductor substrates, the dummy dies 232 can include active circuitry electrically coupled to the solder bumps 234. With such dummy dies 232, the electrical testing performed at step 120 can further test connections between the programmable IC dies 208A, 208B and the dummy dies 232. Such testing can be performed to ensure that there are good electrically connects on the interposer wafer 202 between the programmable IC dies 208A, 208B and the mounting sites 206 for the companion IC dies.

Heterogeneous integration of an integrated circuit (IC) device and a companion device has been described. The disclosed technique provides a chip-on-wafer process that protects companion IC dies from assembly line yield losses, as well as from thermal, mechanical, electrical, and charge damage. The disclosed technique allows for combining companion IC dies with known good primary IC dies, saving costs. The disclosed technique accommodates multiple die stacks of varying thicknesses and sizes. The disclosed technique also provides for improved thermal performance of the resulting packages.

While the foregoing is directed to specific examples, other and further examples may be devised without departing from the basic scope thereof, and the scope thereof is determined by the claims that follow.

What is claimed is:

1. A method of manufacturing a semiconductor assembly, comprising:
   forming first integrated circuit (IC) dies and dummy dies;
   forming an interposer wafer including a top side having first mounting sites for the first IC dies and second mounting sites for second IC dies;
   attaching the first IC dies to the interposer wafer at the first mounting sites and the dummy dies to the interposer wafer at the second mounting sites;
   processing a backside and the top side of the interposer wafer;
   removing the dummy dies from the top side of the interposer wafer to expose the second mounting sites; and
   attaching the second IC dies to the interposer wafer at the exposed second mounting sites.

2. The method of claim 1, further comprising:
   dicing the interposer wafer into a plurality of semiconductor devices each having a first IC die and a second IC die; and
   attaching each semiconductor device to a package substrate.

3. The method of claim 2, further comprising:
   attaching a lid to each package substrate to cover each semiconductor device attached thereto.

4. The method of claim 1, further comprising:
   depositing underfill beneath each of the second IC dies after the second IC dies are attached to the exposed second mounting sites of the interposer wafer.

5. The method of claim 1, wherein the step of attaching the dummy dies to the interposer wafer comprises:
   depositing adhesive over each of the second mounting sites and placing the dummy dies on the adhesive.

6. The method of claim 5, wherein the dummy dies comprises glass substrates, and wherein the step of removing the dummy dies comprises:
   removing the dummy dies using a thermal, chemical, mechanical, or optical process; and
   cleaning the adhesive from the second mounting sites of the interposer wafer.

7. The method of claim 1, further comprising:
   molding the first IC dies and the dummy dies on the top side of the interposer wafer prior to processing the backside and the top side of the interposer wafer.

8. The method of claim 7, wherein the step of processing the top side of the interposer wafer comprises grinding the top side of the interposer wafer to reveal to surfaces of the first IC dies and the dummy dies.

9. The method of claim 1, wherein the step of processing the backside of the interposer wafer comprises:
   performing at least one of deposition, polishing, and etching of the backside of the interposer wafer; and
   bumping the backside of the interposer wafer.

10. The method of claim 9, further comprising:
    performing electrical testing of the interposer wafer after the bumping of the backside of the interposer wafer.

11. The method of claim 1, wherein the dummy dies comprise semiconductor substrates, and wherein the step of attaching the dummy dies to the interposer substrate comprises soldering the dummy dies to the second mounting sites.

12. The method of claim 11, further comprising:
    performing electrical probing of the interposer wafer after the processing of the backside of the interposer wafer.

13. The method of claim 1, wherein a thickness of each of the dummy dies and a thickness of each of the first IC dies is substantially the same.

14. The method of claim 12, wherein a thickness of each of the second IC dies is different than each of the first IC dies.

15. The method of claim 1, wherein the second IC dies each include pre-applied underfill material, and wherein the step of attaching the second IC dies comprises bonding the second IC dies to the interposer wafer using thermal compression bonding.

16. The method of claim 1, wherein the first IC dies are programmable IC dies and the second IC dies are memory dies.

* * * * *